July 27, 1965 G. R. BROUSSARD 3,197,681

SEMICONDUCTOR DEVICES WITH HEAVILY DOPED REGION TO PREVENT SURFACE INVERSION

Filed Sept. 29, 1961 2 Sheets-Sheet 1

GERALD R. BROUSSARD
INVENTOR.

BY John D. Graham
ATTORNEY

GERALD R. BROUSSARD
INVENTOR.

BY John G. Graham
ATTORNEY

United States Patent Office 3,197,681
Patented July 27, 1965

3,197,681
SEMICONDUCTOR DEVICES WITH HEAVILY DOPED REGION TO PREVENT SURFACE INVERSION

Gerald R. Broussard, Richardson, Tex., assignor to Texas Instruments Incorporated, Dallas, Tex., a corporation of Delaware Filed Sept. 29, 1961, Ser. No. 141,708
3 Claims. (Cl. 317—235)

Figures 1A, 1B, 1C, 1D, 1E, 2A, 2B, 2C, 2D:
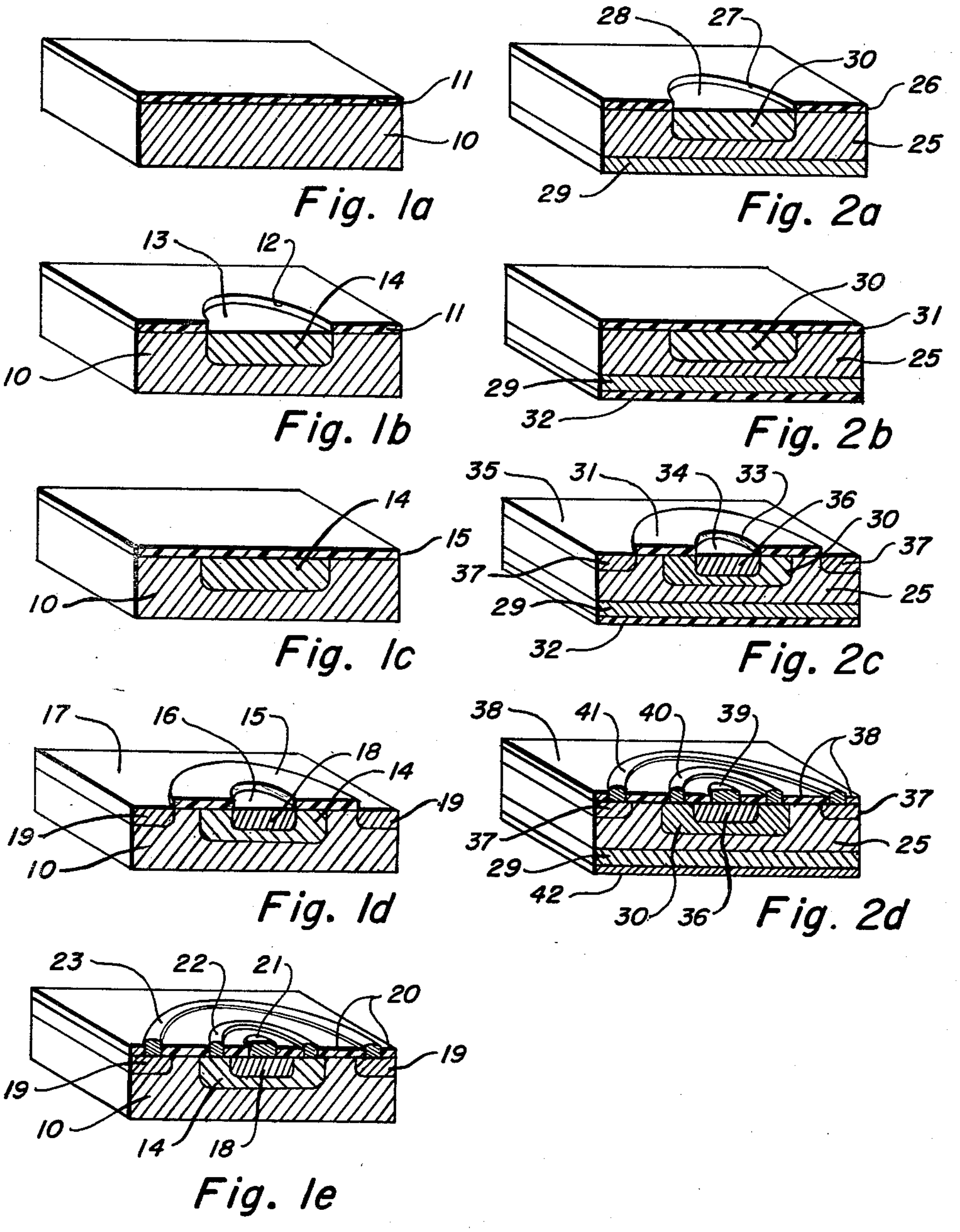

This invention relates to semiconductor devices. More specifically, this invention relates to transistors, switching devices and like semiconductor devices incorporating features to protect against inversion layers on the surface thereof.

Planar transistors are a relatively new concept in the semiconductor field. The designation of a transistor being of the planar type will be distinguished from transistors of the mesa type as follows. As a general rule the base-collector junction area of a mesa type transistor is reduced by etching techniques after the base-collector junction is formed. In the fabrication of a planar type transistor, however, the base-collector, junction area is restricted during its formation, thereby removing the necessity of subsequently reducing this area.

Planar transistors, usually of the NPN silicon variety, ordinarily have the emitter and base contacts on the upper planar surface of the device, the collector contact being made to the bottom of the device by welding or soldering the wafer to a metal header. The present invention provides a method by which not only the emitter and base contact but also the collector contact can be made to a single side of the wafer. An advantage of having all three contacts of a transistor bonded on a single side of the wafer is that the transistor can be easily electrically isolated from the metal header by mounting the wafer on an insulator.

Pure gold, or antimony-doped gold, can be used to alloy the collector of a NPN transistor to a metal header, thus forming an ohmic contact to the collector region. It must be noted, however, that it is extremely hard to control the alloying depth of gold in silicon. Collector regions of transistors are normally sufficiently thick so that no real problem arises when forming the collector contact by alloying the collector side of the transistor wafer to a metal header with a gold preform. This is not the case if the collector contact is to be made to the same surface of the transistor wafer as are the emitter and base contacts. As will be seen in the following discussion, gold cannot be used because of the uncontrollability of the alloying depth in silicon.

The use of aluminum as a metal contacting member is highly desirable in view of its electrical, thermal and physical characteristics. Aluminum can be ohmically alloyed to either p-type or very highly doped n-type silicon, although a strong rectifying junction will be produced if aluminum is alloyed to the lightly doped n-type collector region of an NPN silicon transistor. The present invention provides a method, however, whereby aluminum can be used as the emitter, base and collector contacts by alloying to the three respective regions without creating rectifying junctions. During the emitter diffusion in the fabrication of the transistor, an additional diffusion is made into the upper side of the collector region so that aluminum may consequently be ohmically alloyed thereto.

A silicon dioxide surface layer is often used to protect any normally exposed active junctions from harmful impurities. Although thermally grown silicon dioxide layers are very useful for junction protection, they are not completely effective in preventing contamination.

For example, the surface of a p-type conductivity region can be inverted to n-type conductivity by contaminants. Thus, if the surface of a p-type conductivity base region is inverted to n-type conductivity, an electrical short occurs as a result of the continuous n-type conductivity path from the n-type conductivity emitter region to the n-type conductivity collector region. This is a quite different problem than that encountered when the rectifying junction becomes contaminated. In fact the rectifying junctions of the transistors can be effectively protected from contamination by use of surface layers of silicon dioxide, and yet, some degree of electrical shorting is still prevalent as a result of the inversion of the surfaces of the active regions of the transistor.

Some degree of protection against inversion layers is afforded by methods used in fabricating planar transistors of the prior art. For example, when aluminum, as an electrical contact member, is alloyed to the p-type conductivity base region of a planar NPN silicion transistor, the aluminum increases the p-type impurity level in the vicinity of the silicon-aluminum alloy to such a degree that inversion is practically non-existent. That is, the impurity level in the vicinity of the aluminum contact is increased from about $10^{18}$ impurities per cubic centimeter (about the normal doping level of the base region of an NPN silicon transistor) to about $10^{22}$ impurities per cubic centimeter. Thus, a barrier is provided to prevent electrical conduction across the surface of the base region that ordinarily would exist as a result of the remainder of the base region surface inverting from one type conductivity to the opposite type conductivity.

Although transistors are thus protected against junction contamination and complete inversion of the base region surface, inversion of the collector region surface is still possible. An electrical short can occur from the base region to the ohmic contact on the collector region, thus causing the collector region to be electrically shunted or completely shorted out. The present invention, while providing a planar transistor whereby electrical contacts can be made to the emitter, base and collector regions on one surface of the transistor wafer, also provides a transistor with an effective barrier in the collector region for preventing electrical shorting across the surface of the collector region.

It is a principal object of the present invention to provide a transistor having all of its electrical contacts positioned in substantially one plane. Another object of the present invention is to provide a noval semiconductor switching device having at least three electrical contacts positioned in substantially one plane. A further object is to provide a planar transistor with protection against inversion layers on the surface of the collector region. An additional object is to provide a novel transistor that may easily be mounted on a metal header, and yet, be electrically isolated therefrom. Still another object is to provide an NPN planar transistor utilizing aluminum as a contact member to the collector region.

Other objects and advantages of the present invention will become apparent from the following detailed description when taken in connection with the accompanying drawings, in which;

FIGURES 1*a*–1*e* are pictorial views, in section, of a semiconductor wafer during the fabrication steps of a preferred embodiment of the present invention.

FIGURES 2*a*–2*d* are pictorial views, in section, of a semiconductor wafer in various stages of the fabrication of a PNPN switch according to this invention; and FIGURES 3*a*–3*d* are pictorial views, in section, of a semiconductor wafer in various stages in the fabrication of a NPN mesa transistor according to the present invention.

Referring now to FIGURES 1*a* through 1*e*, a detailed description will be given for the process of fabricating a novel transistor in accordance with this invention. A semiconductor wafer 10, preferably being silicon of N-type conductivity and of resistivity of approximately 10 ohm-cm., is utilized as a starting material. A silicon dioxide layer 11 is formed on one surface of the semiconductor wafer 10 by any well known techniques such as passing steam over the wafer 10 at a temperature of approximately 1100° C. After the oxide layer 11 has been formed, photoresist techniques are used to selectively mask a portion of the layer, a circular portion of the oxide layer 11 in the center being left unmasked. Hydrofluoric acid or some mixture containing hydrofluoric acid is used to remove the unmasked portions of the oxide, thus cutting away a circular portion 12 of the oxide and exposing a surface portion 13 of the semiconductor wafer 10 as shown in FIGURE 1*b*. Subsequently, a P-type determining impurity is diffused into the unmasked portion 13 of the semiconductor wafer 10 to create a P-type region 14. For example, boric acid can be painted on the surface of the wafer and diffused therein. The diffusion is carried out in an open tube furnace at approximately 1000° C. for a period of from about 20 to 30 minutes. Under these conditions, the boron diffuses into the wafer 10 to form a P-type region 14 to a depth of approximately 0.16 mil. During the diffusion of the boron into the semiconductor wafer 10, wet nitrogen is passed over the surface of the wafer, the water in the nitrogen becoming steam and forming an oxide layer 15 over the unmasked portion. Alternatively, the remainder of the oxide coating 11 could be removed and an oxide layer 15 formed over the entire wafer in a subsequent operation. In either case, the top surface of the wafer is covered by oxide. A sectional view of the wafer after the boron diffusion and reoxidation by the wet nitrogen is shown in FIGURE 1*c*. That is, a P-type conductivity base region 14 is formed with a continuous film of silicon dioxide 15 covering the surface of the wafer 10.

Again photoresist techniques are used to selectively mask the silicon dioxide layer 15. The unmasked oxide layer covering a circular portion 16 of the base region 14 as shown in FIGURE 10 is etched away. In addition, a ring of oxide on the outer perimeter of the wafer surface is removed to expose an outer edge 17 of the top surface of the wafer 10. As shown in FIGURE 1*d*, the remainder of the oxide layer 15 covers the junction between the P-type region 14 and the wafer 10.

Phosphorous is diffused into the wafer surface portions 15 and 17 where the silicon dioxide is removed, thus forming a diffused emitter region 18 and a very highly doped N-type region 19 as shown in FIGURE 1*d*. For example, it has been found that heating the silicon wafer 10 to approximately 1200° C. and passing phosphorous pentoxide over the surface thereof will produce a satisfactory diffusion of phosphorous into the wafer in the regions 18 and 19. In this instance, wet nitrogen can be used as a carrier gas for the phosphorous pentoxide, the heated silicon wafer 10 causing the phosphorous pentoxide to decompose and deposit phospohous on the surface thereof. The diffusion is carried out over a time of from about 30 to 60 minutes, thus producing a depth of penetration of approximately 0.11 mil.

During the diffusion of the phosphorous into the wafer 10, silicon dioxide is formed on the surface of the wafer. This is caused by the wet nitrogen flowing over the heated silicon wafer 10. FIGURE 1*d*, a sectional view of the semiconductor wafer 10 after the phosphorous diffusion, shows the emitter region 18 formed by the phosphorous diffusion, the base region 14 formed by the previous boron diffusion, and the highly doped N-type conductivity region 19 formed by the phosphorous diffusion. During the phosphorous diffusion, or subsequently if convenient, a continuous silicon dioxide layer 20 as shown in FIGURE 1*e* is formed over the entire top surface of the semiconductor wafer 10. If the oxide layer 15 has not been removed, it will of course form an integral part of the oxide layer 20.

The diffusion of the boron into the semiconductor wafer 10 has the effect of producing in the wafer a P-type base region 14 having a doping level of about $10^{18}$ P-type impurities per cubic centimeter whereas the original N-type conductivity wafer impurity level is about $10^{16}$ to $10^{17}$ N-type impurities per cubic centimeter. The diffusion of the phosphorous into the P-type conductivity base region 14 has the effect of creating an N-type conductivity emitter region 18 therein. Because of the very high solid solubility of phosphorous in silicon a very high phosphorous surface concentration is attained during the emitter diffusion. The resulting emitter region 18 is highly doped and has in the order of $10^{20}$ (or greater) N-type impurities per cubic centimeter. During the emitter diffusion the heavily doped N-type conductivity region 19 was formed. Since the phosphorous impurities (being N-type conductivity determining in silicon) were diffused into N-type silicon, the resulting N-type impurity concentration of the region 19 is extremely high, being about $10^{22}$ N-type impurities per cubic centimeter.

A perspective view in section of the completed device is seen in FIGURE 1*e*. Photoresist techniques are used to mask the silicon dioxide layer 20 selectively so that a dot-shaped and a pair of concentric ring-shaped portions covering the emitter, base and collector regions, respectively, can be etched away. After etching away appropriate portions of the silicon dioxide, contacting metals are evaporated into the dot- and ring-shaped etched-away portions and subsequently alloyed to the semiconductor wafer to form electrical contacts thereto. For example, aluminum has excellent electrical characteristics and, therefore, is a desirable contacting metal. However, since aluminum is a P-type dope in silicon, special precautions must be taken when alloying aluminum to N-type conductivity silicon to prevent creating a rectifying junction. The semiconductor device as shown in FIGURE 1*e* is designed so that aluminum can be ohmically alloyed to all three active regions. For example, to achieve desirable operating characteristics the emitter region of an NPN transistor is heavily doped to approximately $10^{20}$ impurities per cubic centimeter. Because of the high doping level of the emitter region 18, aluminum may be alloyed thereto with only a very weak rectifying junction resulting. The heavily doped N-type region 19 has even a higher impurity concentration level than the emitter region 18. Thus, aluminum may be alloyed with that region without fear of forming a harmful rectifying junction. It is apparent that aluminum can be alloyed to the P-type base region 14 without forming a rectifying junction. Thus, the transistor shown in FIGURE 1*e* is fabricated in such a way that aluminum may be used to form ohmic contacts to all three active regions of the device. An aluminum contact 21 in the form of a dot is formed on the emitter region 18 in the dot-shaped portion which has been removed from the oxide layer 20. Likewise a ring-shaped aluminum contact 22 is formed on the base region 14 and a concentric ring-shaped aluminum contact 23 is provided for the $n+$region 19 of the collector region 10 where the oxide layer 20 has been removed. Of course, conductive leads may be attached to the contacts 21, 22 and 23 by any suitable technique such as a ball-bonding procedure and the device then encapsulated in an appropriate housing such as a header and can.

As shown in FIGURE 1*e*, a portion of the silicon dioxide layer 20 defining a ring covers the exposed edge of the junction between the emitter region 18 and the base region 14. Likewise, ring-shaped portions of the silicon dioxide layer 20 cover the exposed edges of the junction between the base region 14 and the collector region 10 and one of the junctions between the heavily doped N-type conductivity region 19 and the collector region 10. The silicon dioxide layer 20 including the ringshaped portions covering the junctions permanently remains on the surface of the transistor to protect the normally exposed active junctions of the device from contamination during the manufacturing process and also after incorporation into a completed assembly.

The transistor as shown by the pictorial view in FIGURE 1*e* has the feature of the emitter, base and collector contacts being positioned on the top surface of the active device so that the transistor may easily be electrically isolated from the header. In contrast to previously available planar transistors, the device provided by the present invention may be mounted on a metal header by means of an electrically insulating preform or ceramic wafer. Prior transistors necessarily made use of the bottom side of the active device for the collector contact. The invention provides a method for forming a highly doped region in the top portion of the collector so that contacting material such as aluminum may be alloyed thereto without the danger of a rectifying junction being formed therebetween. The highly doped region formed in the top portion of the collector region serves the additional purpose of acting as a barrier to prevent electrical shorting of the collector region due to surface inversion.

With reference to FIGURES 2*a* throuhg 2*d*, there is shown a PNPN controlled rectifier and method of fabrication thereof which is very similar to the procedure of FIGURES 1*a* to 1*e*. More specifically, FIGURE 2*a* illustrates an N-type silicon wafer 25 which has had an oxide layer 26 deposited on the upper surface thereof. A circular hole 27 has been etched or otherwise removed from the oxide layer 26 to expose a surface portion 28 of the wafer 25. Both sides of the wafer 25 have been subjected to a vapor-solid diffusion process so that P-type impurities are diffused into the lower surface and the exposed portion 28 of the upper surface to form a pair of P-type regions 29 and 30. As shown in FIGURE 2*b*, the remaining oxide layer 26 is removed from the upper surface of the wafer 25 and continuous oxide layers 31 and 32 are formed on both upper and lower surfaces by a procedure as described above. Selected portions of the oxide layer 31 are then removed as shown in FIGURE 2*c* wherein it is seen that a circular hole 33 exposes a surface portion 34 of the diffused P-type region 30 and a peripheral cutaway region 35 epxcses a surface area of the N-type wafer 25. The oxide layer 32 on the lower surface remains intact. After the selected portions of the oxide layer 31 have been removed, the device is subjected to a vapor-solid diffusion process such that an N-type region 36 is formed in the exposed area 34 of the P-type region 30 and at the same time additional donor impurities are diffused into the N-type wafer 25 at the exposed area 35 to create an N+ region 37. The remainder of the oxide layer 31 is then removed along with the oxide layer 32 on the lower surface and a continuous oxide layer 38 is formed on the upper surface as may be seen in FIGURE 2*d*. A small dot-shaped portion is removed from the center of the oxide layer 38 over the N-type region 36 so that an aluminum contact 39 may be evaporated onto the region 36. Likewise, a pair of concentric ring-shaped portions are removed from the oxide layer 38 over the P-type region 30 and the N+ region 37, respectively, so that a pair of aluminum contacts 40 and 41, respectively, may be evaporated on the surface thereof. An aluminum contact 42 is formed on the lower surface of the wafer over the P-type region 29. Conductive leads may be attached to the contacts 39, 40, 41 and 42 by conventional techniques.

The procedure just described provides a PNPN switching device or controlled rectifier as illustrated in FIGURE 2*d* having four electrical contacts, three of which are positioned on the top surface of the device. The controlled rectifier shown in FIGURE 2*d* has the same features and advantages over the prior art as does the NPN transistor shown in FIGURE 1*e*. In addition the present invention provides a method and means for fabricating a silicon controlled rectifier with electrical contacts to all four active regions, whereas previously available controlled rectifiers have had only three electrodes.

It is apparent to those familiar with the operation of a semiconductor controlled rectifier that once the conduction of the device has reached the avalanche value or saturation point a relatively large reverse current or a relatively large backward bias on the gate is necessary to render the device nonconductive. The controlled rectifier in FIGURE 2*d* is provided with an additional control electrode that aids in rendering the device nonconductive. For example, the contacts 39, 40 and 42 may be referred to as the first emitter, gate and second emitter respectively of the standard controlled rectifier. The present invention provides the contact 41 to the collector region 25 or 37. Thus, a current can be produced in the collector region 75 through the contact 41 that ultimately results in a current gain to render the device conductive or nonconductive.

The method of fabricating the controlled rectifier as shown in FIGURE 2*d* is the same as the method for fabricating the NPN silicon transistor shown in FIGURE 1*e* except that the P-type conductivity region 29 is formed during the same diffusion step that the P-type conductivity region 30 is formed. The same diffusant, times and temperatures are applicable in the instant case. In a manner similar to the layer 20 of FIGURE 13, the oxide layer 38 of FIGURE 2*d* protects the junctions between the active regions of the device.

The present invention is also applicable to the formation of a highly doped N-type region in the top portion of the collector region of a mesa transistor. A mesa transistor with the emitter, base and collector contacts positioned on the top surface of the wafer may be fabricated according to a procedure shown in FIGURES 3*a* through 3*d*, the method for fabricating the mesa transistor being similar to that used for making the planar type transistors.

Figure 3A:
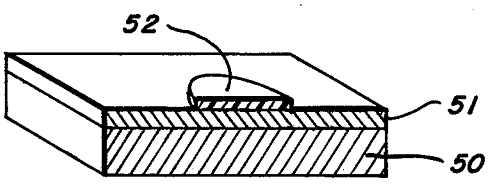
Figure 3B:
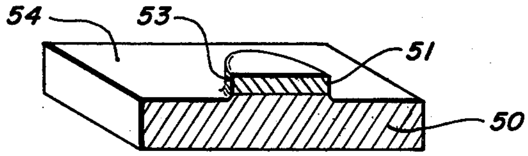
Figure 3C:
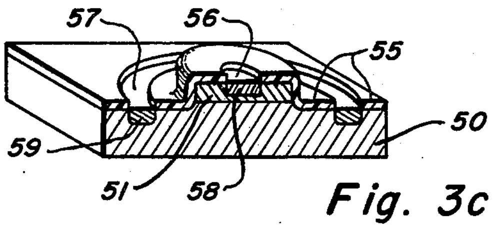
Figure 3D:
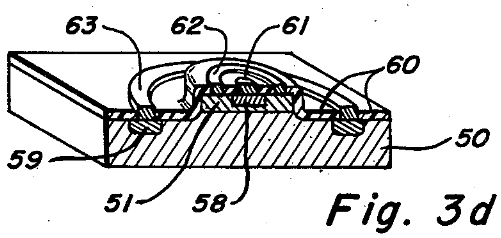

As seen in FIG. 3*a*, a wafer 50 of N-type silicon is subjected to a vapor-solid diffusion process to form a P-type region 51 adjacent to the top surface thereof. An oxide coating is then formed over the entire upper surface, and a selected portion of the oxide is removed by a masking and etching technique, leaving a circular portion 52 of the oxide over the center of the wafer. The top surface of the wafer is then subjected to a mesa etch process in a manner well known in the art whereby the portion of the silicon not protected by the oxide layer 52 is etched away, leaving a mesa 53 and exposing the PN junction and a surface 54 of the N-type layer 50. The oxide layer 52 is removed by cleaning, and another oxide layer 55 is formed over the mesa 53 and the surface 54, as seen in FIGURE 3*c*. A circular hole 56 is formed in the oxide layer 55 on the top of the mesa by masking and etching, while a ring-shaped hole 57 is formed around the outside of the mesa concentric therewith. The top surface is then subjected to a vapor-solid diffusion process whereby an N-type region 58 is formed in the region 51 through the hole 56, while at the same time donor impurities diffuse into the wafer 50 through the hole 57 to form an annular N+ region 59. The oxide layer 55 may then be removed, another oxide layer 60 deposited over the entire surface as seen in FIGURE 3*d* to protect the junctions. A dot-shaped portion of the oxide layer 60 over the N-type emitter region 58 is removed by selective masking and etching while a pair of concentric ring-shaped portions of oxide are removed from over the P-type base region 58 and the N+ region 59. Aluminum contacts 61, 62 and 63 are then evaporated onto the regions 58, 51 and 59, respectively, through the areas which have been removed from the oxide, providing the emitter, base and collector contacts of an NPN transistor. Lead wires may be ball-bonded or otherwise attached to the contacts 61, 62 and 63, and the wafer may be mounted on a header and encapsulated to complete the assembly.

To form a mesa-type PNPN device, the lower surface of the device of FIGS. 3*a*–3*d* may be processed in a manner similar to the device of FIGS. 2*a*–2*d*.

Although the invention has been described with reference to specific examples, it will become apparent to those skilled in the art that modifications and substitutions can be made without departing from the scope of the present invention which is intended to be limited only by the appended claims.

What is claimed is:

1. A transistor comprising a wafer of semiconductor material, a shallow base region defined in the wafer near one major face thereof composed of semiconductor material of conductivity-type opposite to that immediately underlying the base region, the base region occupying only a limited part of the total area of said one major face, a shallow emitter region defined in the wafer near said one major face overlying a portion of the base region and being surrounded by the base region, the emitter region being composed of conductivity-type opposite that of the base region, and means for preventing the effects of inversion of the conductivity type of the surface of the wafer, said means comprising an annular region defined in the wafer near said one major face completely surrounding the base region and laterally spaced therefrom, the annular region being very heavily doped with conductivity-determining impurities of the type opposite that in the base region, the annular region being of the same conductivity type as that of subjacent semiconductor material.

2. In a semiconductor device of the type having a component formed by alternate layers of semiconductor material of opposite conductivity types in a body of semiconductor material near one face thereof, means for preventing the effects of inversion of the conductivity type of the surface of said one face, said means comprising a heavily-doped region of the semiconductor material completely encircling the component on said one face, the heavily-doped region being laterally spaced from said alternate layers, the heavily-doped region being of the same conductivity-type as that of the semiconductor material immediately underlying such region.

3. In a semiconductor device of the type including a body of semiconductor material, a shallow transistor base region defined near a major face of the body and composed of monocrystalline semiconductor material of conductivity-type opposite that of subjacent semiconductor material, a shallow transistor emitter region overlying a portion of the base region near said major face and being surrounded on said one face by the base region, the emitter region being composed of monocrystalline semiconductor material of conductivity-type opposite that of the base region, and means for preventing the effects of inversion of the conductivity type of the surface of said one face comprising a heavily doped region adjacent said one face entirely surrounding the base region but being spaced therefrom composed of semiconductor material of the same conductivity type as but of much greater impurity concentration than subjacent and surrounding semiconductor material.

References Cited by the Examiner

UNITED STATES PATENTS

| | | | |
|---|---|---|---|
| 2,790,940 | 4/57 | Prince | 317—235 |
| 2,847,583 | 8/58 | Lin | 317—235 |
| 2,861,018 | 11/58 | Fuller et al. | 317—235 |
| 2,870,049 | 1/59 | Mueller et al. | 148—1.5 |
| 2,898,247 | 8/59 | Hunter | 148—1.5 |
| 2,918,396 | 12/59 | Hall | 317—235 |
| 2,924,760 | 2/60 | Herlet | 317—235 |
| 2,981,877 | 4/61 | Noyce | 317—235 |
| 2,984,775 | 5/61 | Matlow et al. | 317—240 |
| 2,993,154 | 7/61 | Goldey et al. | 317—235 |
| 3,022,568 | 2/62 | Nelson et al. | 317—235 |
| 3,025,589 | 3/62 | Hoerni | 317—235 X |
| 3,056,888 | 10/62 | Atalla | 317—235 |
| 3,065,392 | 11/62 | Pankove | 317—235 |
| 3,145,328 | 8/64 | Letaw | 317—234 |

JOHN W. HUCKERT, *Primary Examiner.*

JAMES D. KALLAM, *Examiner.*